United States Patent
Futakuchi et al.

(10) Patent No.: US 10,416,200 B2
(45) Date of Patent: Sep. 17, 2019

(54) CURRENT SENSOR

(71) Applicant: Hitachi Metals, Ltd., Tokyo (JP)

(72) Inventors: Naoki Futakuchi, Tokyo (JP); Ken Okuyama, Tokyo (JP)

(73) Assignee: HITACHI METALS, LTD., Tokyo (JP)

( * ) Notice: Subject to any disclaimer, the term of this patent is extended or adjusted under 35 U.S.C. 154(b) by 0 days.

(21) Appl. No.: 15/802,209

(22) Filed: Nov. 2, 2017

(65) Prior Publication Data

US 2018/0143226 A1     May 24, 2018

(30) Foreign Application Priority Data

Nov. 4, 2016    (JP) ................................ 2016-216463

(51) Int. Cl.
    *G01R 19/00*      (2006.01)
    *G01R 33/09*      (2006.01)

(52) U.S. Cl.
    CPC ......... *G01R 19/0092* (2013.01); *G01R 33/09* (2013.01)

(58) Field of Classification Search
    CPC . G01R 15/207; G01R 15/205; G01R 19/0092
    See application file for complete search history.

(56) References Cited

U.S. PATENT DOCUMENTS

| | | | | |
|---|---|---|---|---|
| 9,176,203 B2 * | 11/2015 | Ivanov | .................... | G01R 33/02 |
| 2006/0082357 A1 * | 4/2006 | Tsukamoto | ............ | G01R 15/20 |
| | | | | 324/126 |
| 2007/0063690 A1 * | 3/2007 | De Wilde | .............. | G01R 15/20 |
| | | | | 324/117 R |
| 2010/0026286 A1 * | 2/2010 | Koss | .................... | G01R 15/207 |
| | | | | 324/244 |
| 2011/0227560 A1 * | 9/2011 | Haratani | ................ | B82Y 25/00 |
| | | | | 324/117 R |
| 2013/0113463 A1 * | 5/2013 | Fukuyama | ........... | G01R 15/207 |
| | | | | 324/117 R |
| 2014/0091788 A1 * | 4/2014 | Misaki | ................. | G01R 15/202 |
| | | | | 324/253 |
| 2014/0111196 A1 | 4/2014 | Sakai et al. | | |

(Continued)

FOREIGN PATENT DOCUMENTS

| | | | |
|---|---|---|---|
| JP | 5482736 B2 | | 5/2014 |
| JP | WO2016/056135 A1 | | 4/2016 |
| JP | WO2016148032 | * | 9/2016 |

*Primary Examiner* — Jermele M Hollington
*Assistant Examiner* — Alvaro E Fortich
(74) *Attorney, Agent, or Firm* — McGinn I.P. Law Group, PLLC

(57) ABSTRACT

A current sensor includes a bus bar through which an electric current to be measured flows, a first magnetic sensing element including a first magneto-sensitive portion including a magneto-resistive element, and a second magnetic sensing element including a second magneto-sensitive portion including a magneto-resistive element. Strength of a magnetic field generated by the electric current sensed by the first magneto-sensitive portion is different from a strength of the magnetic field sensed by the second magneto-sensitive portion. A first bias magnetic field is applied to the first magneto-sensitive portion and a second bias magnetic field in a direction opposite to a direction of the first bias magnetic field is applied to the second magneto-sensitive portion.

19 Claims, 6 Drawing Sheets

(56) References Cited

U.S. PATENT DOCUMENTS

2014/0225593 A1* 8/2014 Nakajima .............. G01R 15/20
                                                        324/117 R
2015/0022196 A1* 1/2015 Hebiguchi ........... G01R 15/207
                                                        324/244
2016/0223699 A1* 8/2016 Peczalski ........... G01R 19/0053

* cited by examiner

CURRENT SENSOR

The present application is based on Japanese patent application No. 2016-216463 filed on Nov. 4, 2016, the entire contents of which are incorporated herein by reference.

BACKGROUND OF THE INVENTION

1. Field of the Invention

The present invention relates to a current sensor, more particularly, to a current sensor for detecting an electric current using a magneto-resistive element.

2. Description of the Related Art

Conventionally, a current sensor including a bus bar through which an electric current to be measured flows and magnetic sensing elements such as two GMR (Giant Magneto Resistive) elements for detecting a magnetic field generated by the electric current flowing through the bus bar has been known (See e.g., WO2016/056135).

In the current sensor described in WO2016/056135), the two magnetic sensing elements are installed at positions to which the magnetic field having different strengths is applied, a magnitude of the electric current to be measured is detected based on an output difference between the two magnetic sensing elements, the influence of an external magnetic field in a magneto-sensitive axis direction of the two magnetic sensing elements can be cancelled.

Further, a current sensor in which magneto-resistive elements and a conductor through which an electric current to be measured flows are covered with a magnetic shield has been known conventionally (See e.g., Japanese Patent No. 5482736).

In the current sensor described in Japanese Patent No. 5482736, an inside of the magnetic shield can magnetically shielded from the outside of the magnetic shield.

SUMMARY OF THE INVENTION

When a magneto-resistive element (MR element) such as GMR element is used as a magnetic sensing element in a current sensor, there is an advantage in that a core is not required, but on the other hand, there is a disadvantage in that the current sensor becomes reduced to a disturbing magnetic field.

According to the current sensor described in WO2016/056135, although the influence of the external magnetic field of the magneto-sensitive axis direction can be cancelled by taking an output difference between the two magnetic sensing elements, the influence of the disturbing magnetic field in a sensitivity-influencing axis direction which is perpendicular to the magneto-sensitive axis direction cannot be suppressed. The disturbing magnetic field in the sensitivity-influencing axis direction changes the sensitivity of the magnetic sensing element and affects the output therefrom.

Therefore, a magnetic shield used in the current sensor described in Japanese Patent No. 5482736 would be indispensable to prevent the disturbing magnetic field in the current sensor described in WO2016/056135. However, upsizing of the sensor would be inevitable when such a magnetic shield is used.

Accordingly, it is an object of the present invention to provide a current sensor using a magneto-resistive element, which can suppress not only the influence of the disturbing magnetic field in the magneto-sensitive axis direction of the magnetic sensing element but also the influence of the disturbing magnetic field in the sensitivity-influencing axis direction.

One aspect of the present invention provides a current sensor comprising:

a bus bar through which an electric current to be measured flows;

a first magnetic sensing element including a first magneto-sensitive portion comprising a magneto-resistive element; and a second magnetic sensing element including a second magneto-sensitive portion comprising a magneto-resistive element, in which a strength of a magnetic field generated by the electric current sensed by the first magneto-sensitive portion is different from a strength of the magnetic field sensed by the second magneto-sensitive portion, in which a first bias magnetic field is applied to the first magneto-sensitive portion and a second bias magnetic field in a direction opposite to a direction of the first bias magnetic field is applied to the second magneto-sensitive portion.

Effects of the Invention

According to the present invention, it is possible to provide a current sensor using a magneto-resistive element, which can suppress not only the influence of the disturbing magnetic field in the magneto-sensitive axis direction of the magnetic sensing element but also the influence of the disturbing magnetic field in the sensitivity-influencing axis direction.

BRIEF DESCRIPTION OF THE DRAWINGS

Next, the present invention will be explained in more detail in conjunction with appended drawings, wherein.

DETAILED DESCRIPTION OF THE EMBODIMENT (Configuration of a Current Sensor)

Figure 1:
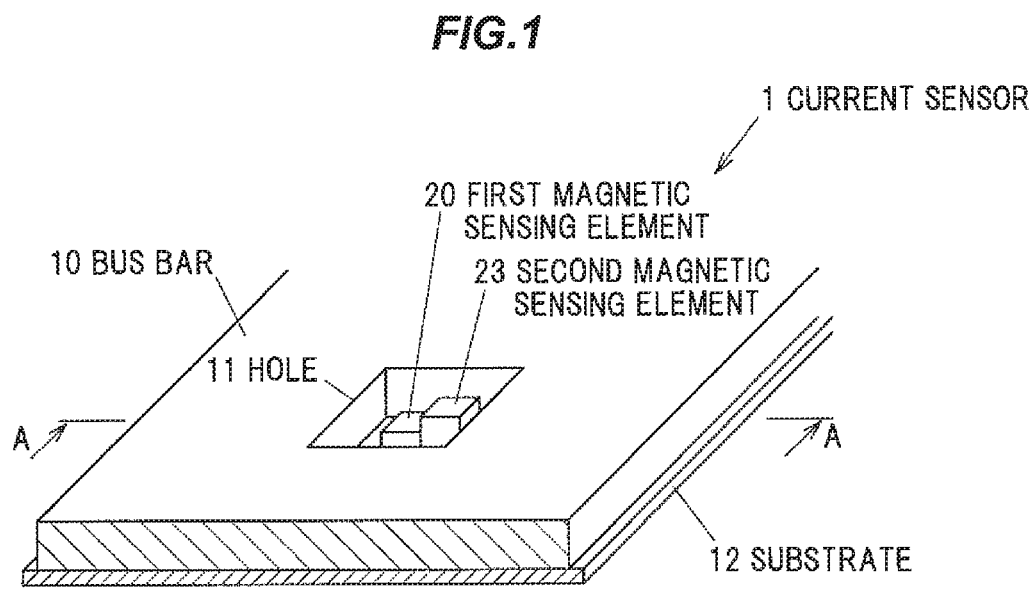
FIG. 1 is a perspective view showing a configuration of a current sensor in an embodiment according to the present invention.
Figure 2:
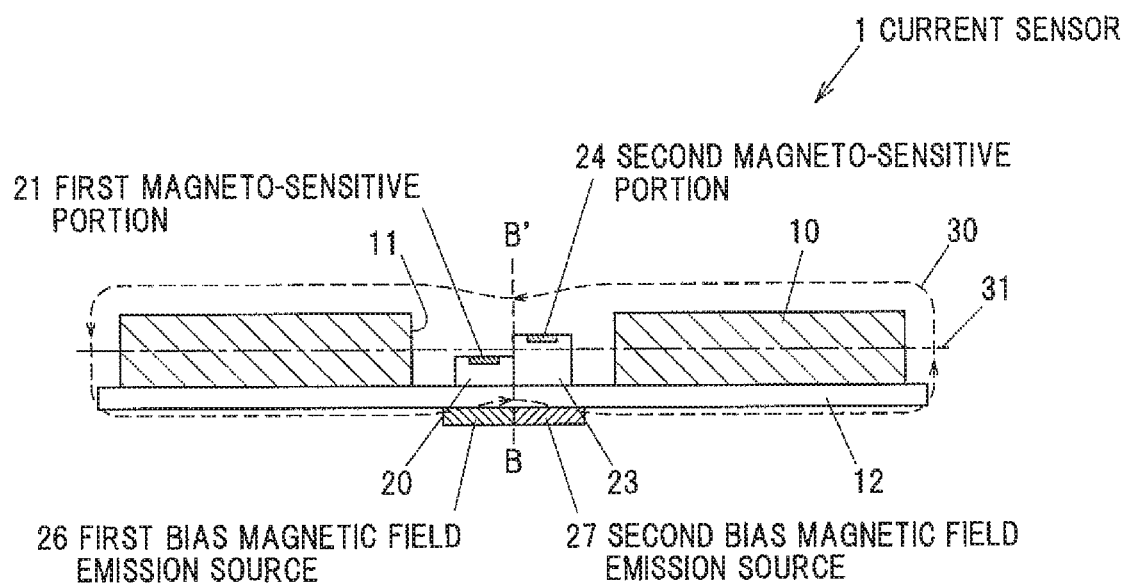
FIG. 2 is a vertical cross sectional view of a cross section of the current sensor cut along A-A line in FIG. 1 in a vertical direction and viewed in a direction of an arrow.

FIG. 1 is a perspective view showing a configuration of a current sensor 1 in an embodiment according to the present invention. FIG. 2 is a vertical cross sectional view of a cross section of the current sensor 1 cut along A-A line in FIG. 1 in a vertical direction and viewed in a direction of an arrow.

The current sensor 1 comprises a bus bar 10, a first magnetic sensing element 20 and a second magnetic sensing element 23 for detecting a magnetic field generated by an electric current flowing through the bus bar 10, a first bias magnetic field emission source 26 which applies a bias magnetic field to the first magnetic sensing element 20, and a second bias magnetic field emission source 27 which applies a bias magnetic field to the second magnetic sensing element 23.

The first magnetic sensing element 20 and the second magnetic sensing element 23 comprise a first magneto-sensitive portion 21 and a second magneto-sensitive portion 24 each of which comprises a magneto-resistive element such as GMR element, respectively. The strength of a magnetic field which is generated by the electric current flowing through the bus bar 10 and detected by the first magneto-sensitive portion 21 is different from the strength of the magnetic field which is detected by the second magneto-sensitive portion 24, so that a first output voltage $V_{out1}$ of the first magneto-sensitive portion 21 is different from an output voltage $V_{out2}$ of the second magneto-sensitive portion 24.

The current sensor 1 measures a current value flowing through the bus bar 10 from a differential output voltage, which is a differential value between the output voltage $V_{out1}$ of the first magneto-sensitive portion 21 and the output voltage $V_{out2}$ of the second magneto-sensitive portion 24. The first magneto-sensitive portion 21 and the second magneto-sensitive portion 24 are connected to a differential output section (not shown) for taking a difference between the output voltage $V_{out1}$ and the output voltage $V_{out2}$ and outputting the difference as the differential output voltage.

The bus bar 10 is a perforated tabular bus bar having a hole 11. FIG. 1 shows a peripheral portion of the hole 11 of the bus bar 10. The first magnetic sensing element 20 and the second magnetic sensing element 23 are installed inside the hole 11 of the bus bar 10. The thickness of the bus bar 10 is e.g. 1 mm to 3 mm.

In this embodiment, the bus bar 10, the first magnetic sensing element 20 and the second magnetic sensing element 23 are mounted together on a substrate 12.

As the first bias magnetic field emission source 26 and the second bias magnetic field emission source 27, e.g. a bias magnetic field magnet, a bias coil, or the like may be used. The bias coil is a coil which can generate a bias magnetic field by an electric current flown therethrough.

Dotted line 30 with an arrow in FIG. 2 schematically represents a magnetic field (hereinafter referred to as "magnetic field to be measured") around the bus bar 10, which is generated by the electric current flowing through the bus bar 10. In the example shown in FIG. 2, the electric current flows from a depth side toward a front side and perpendicularly to a drawing sheet and the magnetic field to be measured is generated around the bus bar 10 in the counterclockwise direction.

Figure 3:
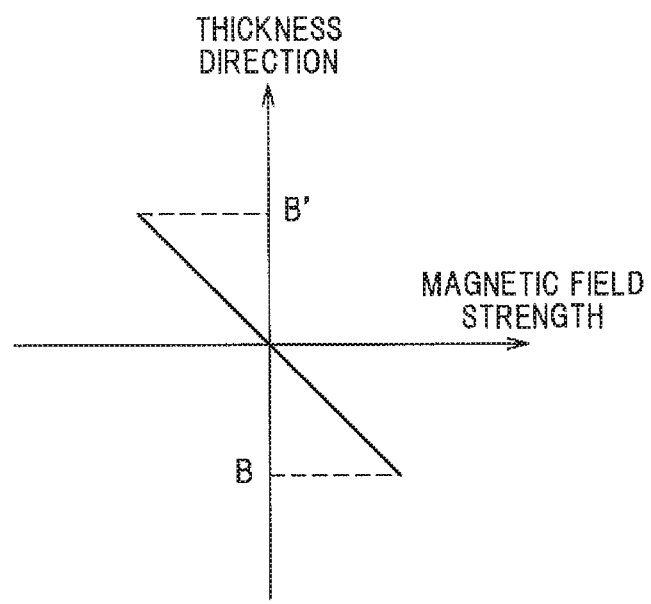
FIG. 3 is a graph showing relations between positions of a bus bar on a straight line in a thickness direction which passes through B, B' in FIG. 2 and strength of a magnetic field generated by an electric current flowing through the bus bar.

FIG. 3 is a graph showing relations between the positions of the bus bar 10 on a straight line in the thickness direction which passes through B, B' in FIG. 2 and the strength of the magnetic field generated by the electric current flowing through the bus bar 10. The origin of a vertical axis in FIG. 3 is a center of the thickness direction of the bus bar 10. As shown in FIG. 3, the magnetic field to be measured is reduced in accordance with an approximation to the center in the thickness direction of the bus bar 10 and the magnetic field strength is increased linearly in accordance with a distance from the center in the thickness direction of the bus bar 10 up to a predetermined distance.

A differential value between these output voltages hardly changes by providing the first magneto-sensitive portion 21 and the second magneto-sensitive portion 24 within such an area in the thickness direction that the magnetic field strength increases and decreases linearly even if the first magneto-sensitive portion 21 and the second magneto-sensitive portion 24 are displaced in the thickness direction of the bus bar 10.

Generally, in an ordinary current sensor, there is a disadvantage in that the strength of the magnetic field generated by the electric current to be measured, which flows through the perforated bus bar, changes largely along the thickness direction of the bus bar, so that the output changes largely even by a slight displacement (misalignment) of the magneto-sensitive portions.

According to the current sensor 1 in the present embodiment, it is possible to relax the influence on the output of the current sensor 1 by the displacement of the first magneto-sensitive portion 21 and the second magneto-sensitive portion 24, by installing the first magneto-sensitive portion 21 and the second magneto-sensitive portion 24 within the area in the thickness direction where the magnetic field strength increases and decreases linearly, and taking the difference between the output voltages.

In the current sensor 1, the components of the disturbing magnetic field in the magneto-sensitive axis direction of the first magneto-sensitive portion 21 and the second magneto-sensitive portion 24 can be cancelled by taking the difference between the output voltage $V_{out1}$ of the first magneto-sensitive portion 21 and the output voltage $V_{out2}$ of the second magneto-sensitive portion 24. It is preferable that the sensitivity of the second magneto-sensitive portion 24 would be the same as the sensitivity of the first magneto-sensitive portion 21 to cancel the components of this disturbing magnetic field in the magneto-sensitive axis direction more effectively. Here, the magneto-sensitive axis direction of the first magneto-sensitive portion 21 and the second magneto-sensitive portion 24 means a direction in which an absolute value of the output voltage increases when the magnetic field in this direction is applied.

The magneto-resistive elements constituting the first magneto-sensitive portion 21 and the second magneto-sensitive portion 24 comprises a laminated structure including a free layer in which a magnetization direction changes depending on a direction of the external magnetic field, and a fixed layer in which a magnetization direction is fixed. When the magnetization direction of the free layer coincides with the magnetization direction of the fixed layer, in other words, when the magnetic field is applied to the magnetization direction of the fixed layer, a resistance value would be at minimum. When the magnetization direction of the free layer is opposite (reverse) to the magnetization direction of the fixed layer, in other words, when the magnetic field is applied to the opposite (reverse) direction of the magnetization direction of the fixed layer, the resistance value would be at maximum. Therefore, the magneto-sensitive axis direction of the first magneto-sensitive portion 21 and the second magneto-sensitive portion 24 is parallel in the magnetization direction of the fixed layer of the magneto-resistive element constituting the first magneto-sensitive portion 21 and the second magneto-sensitive portion 24.

Further, it is preferable that the output voltage of the first magnetic sensing element 20 and the output voltage of the second magnetic sensing element 23 are as high as possible and the increase and decrease of the output voltage of the first magnetic sensing element 20 in response to the change in the magnetic field to be measured is opposite to the output voltage of the second magnetic sensing element 23, so as to increase the differential output voltage which is provided by taking the difference between the output voltage of first magneto-sensitive portion 21 and the output voltage of the second magneto-sensitive portion 24.

Because the direction of the magnetic field to be measured is parallel to the drawing sheet of FIG. 2 in the current sensor 1, it is preferable that the magneto-sensitive axis direction of the first magneto-sensitive portion 21 and the second magneto-sensitive portion 24 would be parallel to the drawing sheet of FIG. 2. Further, the first magneto-sensitive portion 21 and the second magneto-sensitive portion 24 are preferably installed such that the magneto-sensitive axis direction would be parallel to a principal surface (the surface with a largest area) of the bus bar 10 because the magnetic field penetrates through the first magneto-sensitive portion 21 and the second magneto-sensitive portion 24 approximately parallel to the principal surface of the bus bar 10.

Further, it is preferable that the magneto-sensitive axis direction of the first magneto-sensitive portion 21 is the same as the magneto-sensitive axis direction of the second magneto-sensitive portion 24 and that the first magneto-sensitive portion 21 is located below the point where the magnetic field to be measured becomes zero and the second magneto-sensitive portion 24 is located above the point where the magnetic field to be measured becomes zero. Thereby, the increase and decrease of the output voltage of first magnetic sensing element 20 in response to the change of the magnetic field to be measured can be made opposite to the increase and decrease of the output voltage of the second magnetic sensing element 23 in response to the change of the magnetic field to be measured.

A surface 31 represented by a dash line in FIG. 2 is a surface which is in parallel to the principal surface of the bus bar 10 and passing through the center of the thickness direction of the bus bar 10, and the magnetic field to be measured becomes zero on the surface 31. Therefore, as shown in FIG. 2, it is preferable that the first magneto-sensitive portion 21 is located below the surface 31, and the second magneto-sensitive portion 24 is located above the surface 31.

In this embodiment, the bus bar 10, the first magnetic sensing element 20 and the second magnetic sensing element 23 are installed together on a substrate 12, and the first magneto-sensitive portion 21 and the second magneto-sensitive portion 24 are installed on the first magnetic sensing element 20 and the second magnetic sensing element 23, respectively. Therefore, the positions of the first magneto-sensitive portion 21 and the second magneto-sensitive portion 24 in the thickness direction of the bus bar 10 can be adjusted by regulating the height of the first magnetic sensing element 20 and the height of second magnetic sensing element 23.

Note that a difference in height between the first magneto-sensitive portion 21 and the second magneto-sensitive portion 24 (a level difference between the first magnetic sensing element 20 and the second magnetic sensing element 23) is preferably not smaller than 0.5 mm in consideration of a deviation between a setting position for installing the first magneto-sensitive portion 21 below the point where the magnetic field to be measured becomes zero and a setting position for installing the second magneto-sensitive portion 24 above the point where the magnetic field to be measured becomes zero. Further, it is preferable that a difference in height between the first magneto-sensitive portion 21 and the second magneto-sensitive portion 24 (a level difference between the first magnetic sensing element 20 and the second magnetic sensing element 23) is preferably smaller than the thickness of the bus bar 10 (e.g., 2 mm to 3 mm) because the magnetic field to be measured by the first magneto-sensitive portion 21 and the second magneto-sensitive portion 24 changes linearly in the thickness direction of the bus bar 10.

Figure 4:
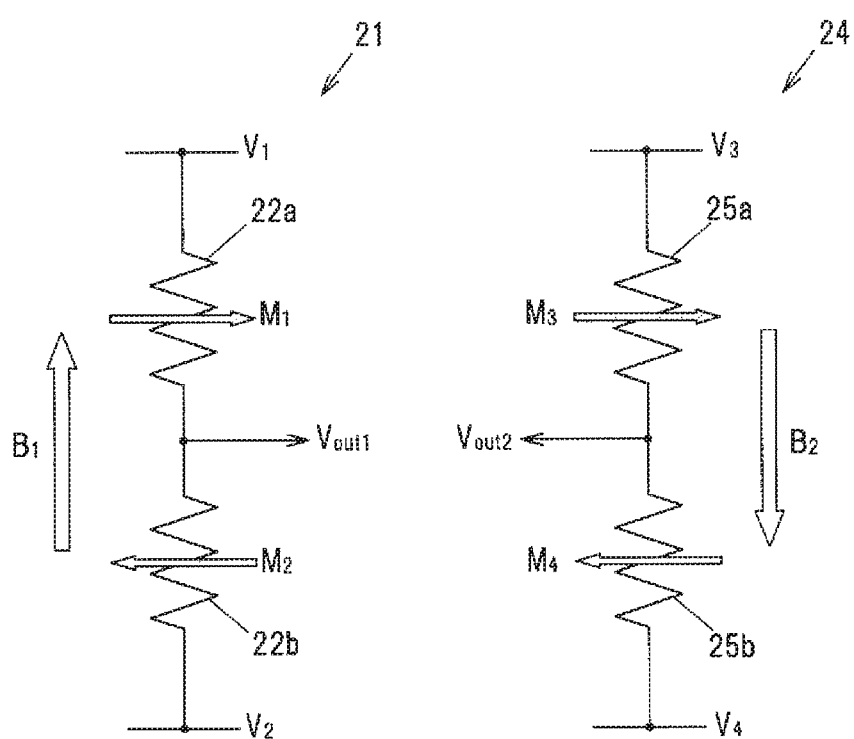
FIG. 4 is a schematic diagram showing configurations of a first magneto-sensitive portion and a second magneto-sensitive portion.

FIG. 4 is a schematic diagram showing configurations of the first magneto-sensitive portion 21 and the second magneto-sensitive portion 24. The first magneto-sensitive portion 21 has a half bridge structure in which a magneto-resistive element 22a and a magneto-resistive element 22b are serially-connected. The second magneto-sensitive portion 24 has a half bridge structure in which a magneto-resistive element 25a and a magneto-resistive element 25b are serially-connected likewise. The magneto-resistive elements 22a, 22b, 25a, 25b are typically GMR elements.

Hereinafter, a power supply voltage applied to a magneto-resistive element 22a side of the first magneto-sensitive portion 21 is referred to as $V_1$, and a power supply voltage applied to the magneto-resistive element 22b side of the first magneto-sensitive portion 21 is referred to as $V_2$. Also, a power supply voltage applied to a magneto-resistive element 25a side of the second magneto-sensitive portion 24 is referred to as $V_3$, and a power supply voltage applied to a magneto-resistive element 25b side of the second magneto-sensitive portion 24 is referred to as V4.

Arrows $M_1$, $M_2$, $M_3$, $M_4$ in FIG. 4 show the magnetization directions of the fixed layers of the magneto-resistive elements 22a, 22b, 25a, 25b, respectively. Also, arrows $B_1$, $B_2$ show the direction of the bias magnetic field applied to the first magneto-sensitive portion 21 by the first bias magnetic field emission source 26 and the direction of the bias magnetic field applied to the second magneto-sensitive portion 24 by the second bias magnetic field emission source 27, respectively.

Arrows $M_1$, $M_2$, $M_3$, $M_4$, $B_1$, $B_2$ show the relative direction relations between the magnetization directions $M_1$, $M_2$, $M_3$, $M_4$ of the fixed layers and the bias magnetic fields $B_1$, $B_2$. The magnetization direction $M_1$ of the fixed layer and the magnetization directions $M_2$, $M_3$, $M_4$ of the fixed layers are in the directions opposite to each other. Note that the magneto-sensitive axis direction of the first magneto-sensitive portion 21 is parallel to the magnetization direction $M_1$, $M_2$ of the fixed layers, and the magneto-sensitive axis direction of the second magneto-sensitive portion 24 is parallel to the magnetization directions $M_3$, $M_4$ of the fixed layers.

The bias magnetic fields $B_1$, $B_2$ are applied in the sensitivity-influencing axis directions of the magneto-resistive elements 22a, 22b, 25a, 25b.

This sensitivity-influencing axis direction is a direction which is parallel to the free layer and the fixed layer of the magneto-resistive element and perpendicular to the magneto-sensitive axis direction of the magneto-resistive element, and it is possible to adjust the sensitivity of the magneto-resistive element by applying the bias magnetic field in this direction. The sensitivity-influencing axis direction of the first magneto-sensitive portion 21 is a direction perpendicular to the magnetization directions $M_1$, $M_2$ of the fixed layers, and the sensitivity-influencing axis direction of the second magneto-sensitive portion 24 is a direction perpendicular to the magnetization directions $M_3$, $M_4$ of the fixed layers. For example, as described above, although the magneto-sensitive axis directions of the first magneto-sensitive portion 21 and the second magneto-sensitive portion 24 are preferably parallel to the drawing sheet of FIG. 2 and parallel to the principal surface of the bus bar 10, the sensitivity-influencing axis directions of the first magneto-sensitive portion 21 and the second magneto-sensitive portion 24 in this case are perpendicular to the drawing sheet of FIG. 2.

Specifically, the sensitivity of the magneto-resistive element 22a, 22b decreases in accordance with the increase in strength of the bias magnetic field $B_1$, and the sensitivity of the magneto-resistive element 25a, 25b decreases in accordance with the increase in strength of the bias magnetic field $B_2$ likewise.

Here, the bias magnetic field $B_1$ and the bias magnetic field $B_2$ are in the directions opposite to each other. Thereby, it is possible to suppress the variation in the sensitivity of the first magneto-sensitive portion 21 and the second magneto-sensitive portion 24 due to the component of the disturbing magnetic field in the sensitivity-influencing axis direction.

For example, when the disturbing magnetic field in the direction of the bias magnetic field $B_1$ is applied to the first magneto-sensitive portion 21 and the second magneto-sensitive portion 24, the bias magnetic field $B_1$ is strengthened while the sensitivity of the first magneto-sensitive portion 21 decreases. On the other hand, the bias magnetic field $B_2$ is weakened by this disturbing magnetic field since the bias magnetic field $B_2$ is in the opposite direction to the bias magnetic field $B_1$, and the sensitivity of the second magneto-sensitive portion 24 is enhanced. Therefore, the differential output voltage which is a differential value between the output voltage of the first magneto-sensitive portion 21 and the output voltage of the second magneto-sensitive portion 24 is not substantially different from a differential value in the case where a disturbing magnetic field is not applied.

Note that the sensitivity of the magneto-resistive element can be adjusted even if the bias magnetic fields $B_1$, $B_2$ are not parallel to the sensitivity-influencing axis direction. However, the bias magnetic fields $B_1$, $B_2$ are preferably applied in the sensitivity-influencing axis direction so as not to change the magnetic field in the magneto-sensitive axis direction.

Further, it is possible to achieve the effect for suppressing the variation in the sensitivity of the first magneto-sensitive portion 21 and the second magneto-sensitive portion 24 due to the component of the disturbing magnetic field in the sensitivity-influencing axis direction by arranging the bias magnetic field $B_1$ and the bias magnetic field $B_2$ in the directions opposite to each other without depending on the shape of the bus bar 10 and a physical relationship of the bus bar 10 with the first magneto-sensitive portion 21 and the second magneto-sensitive portion 24.

Figure 5A:
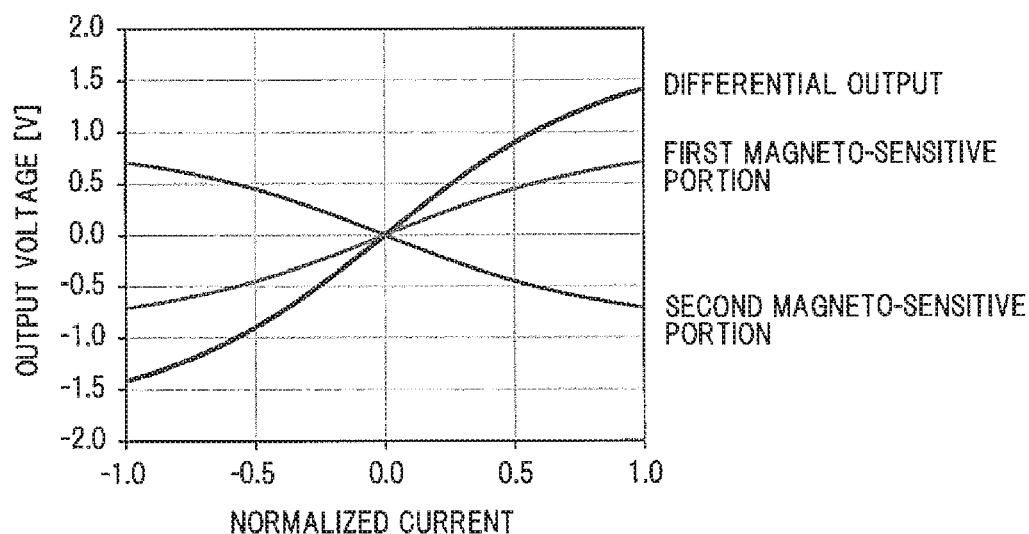
FIG. 5A is a graph showing changes of an output voltage of the first magneto-sensitive portion and an output voltage of the second magneto-sensitive portion with respect to a normalized current as well as a differential output voltage which is a differential value therebetween, when magnetization directions of fixed layers of the magneto-resistive elements and a direction of a bias magnetic field are in a relation shown in FIG. 4.

FIG. 5A is a graph showing changes of the output voltage of the first magneto-sensitive portion 21 and the output voltage of the second magneto-sensitive portion 24 with respect to a normalized current as well as a differential output voltage which is a differential value therebetween, when the magnetization directions of fixed layers of the magneto-resistive elements 22a, 22b, 25a, 25b and the direction of the bias magnetic field is in a relation shown in FIG. 4. Here, the normalized current means that the electric current to be measured, which flows through the bus bar 10, is normalized by a certain reference current, e.g., measured electric current maximum value.

Figure 5B:
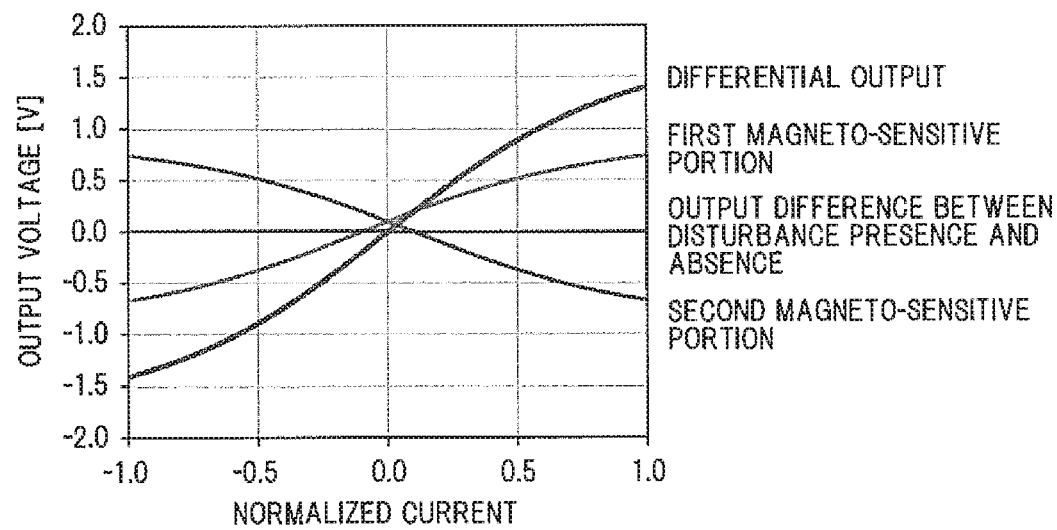
FIG. 5B is a graph showing changes of an output voltage of the first magneto-sensitive portion and an output voltage of the second magneto-sensitive portion with respect to the normalized current as well as a differential output voltage which is a differential value therebetween, when a disturbing magnetic field in a magneto-sensitive axis direction of the first magneto-sensitive portion and the second magneto-sensitive portion is applied.

FIG. 5B is a graph showing changes of the output voltage of the first magneto-sensitive portion 21 and the output voltage of the second magneto-sensitive portion 24 with respect to the normalized current as well as the differential output voltage which is a differential value therebetween, when the disturbing magnetic field in the magneto-sensitive axis direction of the first magneto-sensitive portion 21 and the second magneto-sensitive portion 24 is applied.

Comparing FIG. 5B with FIG. 5A, the output voltage of the first magneto-sensitive portion 21 and the output voltage of the second magneto-sensitive portion 24 are shifted upwardly under the influence of the disturbing magnetic field in the magneto-sensitive axis direction. However, the differential output voltage hardly changes from the case where the disturbing magnetic field in the magneto-sensitive axis direction is not applied, because the shifting amounts are substantially the same. Note that the differential output voltage hardly changes from the case where the disturbing magnetic field in the magneto-sensitive axis direction is not applied when the output voltage of the first magneto-sensitive portion 21 and the output voltage of the second magneto-sensitive portion 24 are shifted downwardly, similarly.

In FIG. 5B, the "output difference between disturbance presence and absence" means a difference in the differential output voltage between the case where there is the disturbing magnetic field in the magneto-sensitive axis direction and the case where there is no disturbing magnetic field in the magneto-sensitive axis direction, namely, the difference between the differential output voltage when the disturbing magnetic field in the magneto-sensitive axis direction is applied as shown in FIG. 5B and the differential output voltage when the disturbing magnetic field in the magneto-sensitive axis direction is not applied as shown in FIG. 5B.

The "output difference between disturbance presence and absence" in FIG. 5B is approximately 0 regardless of the magnitude of the normalized current, namely it shows that the disturbing magnetic field in the magneto-sensitive axis direction hardly affects the differential output voltage.

Figure 6A:
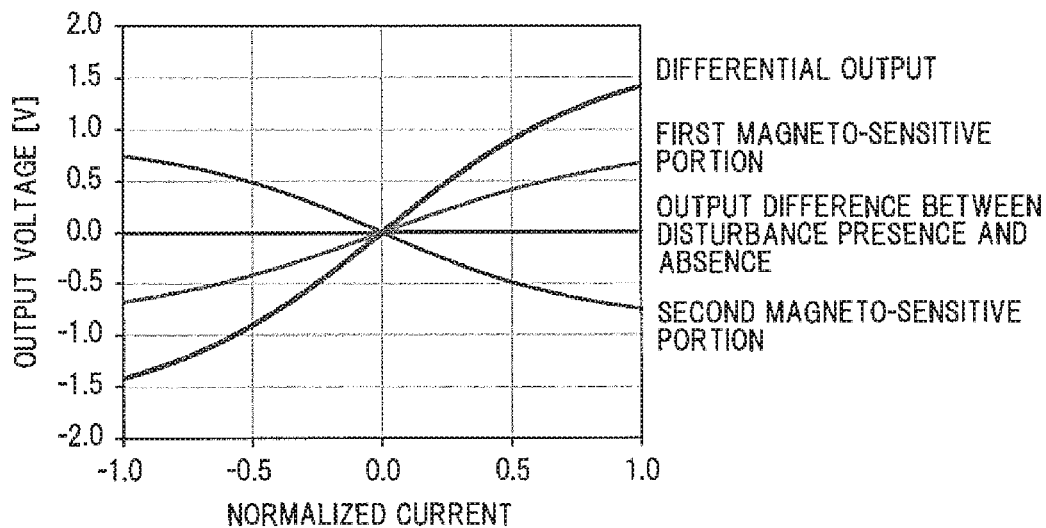
FIG. 6A is a graph showing changes of an output voltage of the first magneto-sensitive portion and an output voltage of the second magneto-sensitive portion with respect to the normalized current as well as a differential output voltage which is a differential value therebetween, when a disturbing magnetic field in a sensitivity-influencing axis direction of the first magneto-sensitive portion and the second magneto-sensitive portion is applied.

FIG. 6A is a graph showing changes of the output voltage of the first magneto-sensitive portion 21 and the output voltage of the second magneto-sensitive portion 24 with respect to the normalized current as well as the differential output voltage which is the differential value therebetween, when the disturbing magnetic field in the sensitivity-influencing axis direction of the first magneto-sensitive portion 21 and the second magneto-sensitive portion 24 is applied.

Figure 6B:
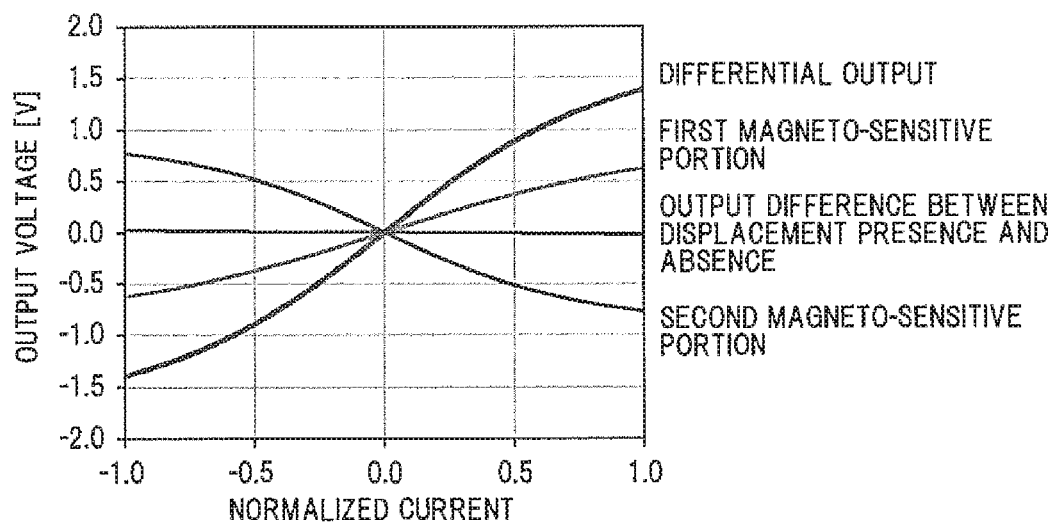
FIG. 6B is a graph showing changes of an output voltage of the first magneto-sensitive portion and an output voltage of the second magneto-sensitive portion with respect to the normalized current as well as a differential output voltage which is a differential value therebetween, when positions of the first magneto-sensitive portion and the second magneto-sensitive portion are displaced toward the thickness direction of the bus bar.

Comparing FIG. 6B with FIG. 5A, an inclination of a curve of the output voltage of the first magneto-sensitive portion 21 is reduced and an inclination of a curve of the output voltage of the second magneto-sensitive portion 24 is increased under the influence of the disturbing magnetic field in the sensitivity-influencing axis direction. However, the differential output voltage hardly changes from the case where the disturbing magnetic field in the sensitivity-influencing axis direction is not applied, because the changing amounts of these inclinations are substantially the same. Note that the differential output voltage hardly changes from the case where the disturbing magnetic field in the sensitivity-influencing direction is not applied when the inclination of the curve of the output voltage of the first magneto-sensitive portion 21 is increased and the inclination of the curve of the output voltage of the second magneto-sensitive portion 24 is reduced, similarly.

Because the bias magnetic field $B_1$ and the bias magnetic field $B_2$ are in the directions opposite to each other, the increase and decrease of the sensitivity of the first magneto-sensitive portion 21 and the increase and decrease of the sensitivity of the second magneto-sensitive portion 24 due to the disturbing magnetic field in the sensitivity-influencing axis direction are opposite to each other, so that a direction of the inclination of the curve of the output voltage of first magneto-sensitive portion 21 is different from a direction of the inclination of the output voltage of the second magneto-sensitive portion 24.

In FIG. 6A, the "output difference between disturbance presence and absence" means a difference in the differential output voltage between the case where there is the disturbing magnetic field in the sensitivity-influencing axis direction and the case where there is no disturbing magnetic field in the sensitivity-influencing axis direction, namely, the difference between the differential output voltage when the disturbing magnetic field in the sensitivity-influencing axis direction is applied as shown in FIG. 6A and the differential output voltage when the disturbing magnetic field in the sensitivity-influencing axis direction is not applied as shown in FIG. 5A.

The "output difference between disturbance presence and absence" in FIG. 6A is approximately 0 regardless of the magnitude of the normalized current, namely it shows that the disturbing magnetic field in the sensitivity-influencing axis direction hardly affects the differential output voltage.

FIG. 6B is a graph showing changes of an output voltage of the first magneto-sensitive portion 21 and an output voltage of the second magneto-sensitive portion 24 with respect to the normalized current as well as a differential output voltage which is a differential level therebetween, when positions of the first magneto-sensitive portion 21 and the second magneto-sensitive portion 24 are displaced toward the thickness direction of the bus bar 10. Note that the magnitude of the displacement of the positions of the first magneto-sensitive portion 21 and the second magneto-sensitive portion 24 in the example shown in FIG. 6B is 10% of the difference in height between the first magneto-sensitive portion 21 and the second magneto-sensitive portion 24.

Comparing FIG. 6B with FIG. 5A, an inclination of a curve of the output voltage of the first magneto-sensitive portion 21 is reduced and an inclination of a curve of the output voltage of the second magneto-sensitive portion 24 is increased under the influence of the displacement in the thickness direction of the bus bar 10. However, the differential output voltage hardly changes from the case where the disturbing magnetic field in the sensitivity-influencing axis direction is not applied, because the changing amounts of these inclinations are substantially the same. Note that the differential output voltage hardly changes from the case where the disturbing magnetic field in the sensitivity-influencing direction is not applied when the inclination of the curve of the output voltage of the first magneto-sensitive portion 21 is increased and the inclination of the curve of the output voltage of the second magneto-sensitive portion 24 is reduced, similarly.

The first magneto-sensitive portion 21 and the second magneto-sensitive portion 24 are installed within such an area in the thickness direction of the bus bar 10 that the magnetic field strength increases linearly as shown in FIG. 3, so that the changing amounts of the inclination of the curve of the output voltage of the first magneto-sensitive portion 21 and the inclination of the curve of the output voltage of the second magneto-sensitive portion 24 are substantially the same.

In FIG. 6B, the "output difference between disturbance presence and absence" means a difference in the differential output voltage between the case where there is the displacement between the positions of the first magneto-sensitive portion 21 and the second magneto-sensitive portion 24 and the case where there is no displacement between the positions of the first magneto-sensitive portion 21 and the second magneto-sensitive portion 24, namely, the difference between the differential output voltage when there is the displacement as shown in FIG. 6A and the differential output voltage when there is not displacement as shown in FIG. 5A.

The "output difference between disturbance presence and absence" in FIG. 6B is approximately 0 regardless of the magnitude of the normalized current, namely it shows that the displacement in the thickness direction of the bus bar 10 hardly affects the differential output voltage.

As described above, according to the current sensor 1 of the present invention, it is possible to suppress not only the influence of the disturbing magnetic field component in the magneto-sensitive axis direction of the magnetic sensing element but also the influence of the disturbing magnetic field component in the sensitivity-influencing axis direction on the output of the current sensor 1. Also, the magneto-resistive element is, originally, not affected by the disturbing magnetic field in the direction that is perpendicular to the free layer and the fixed layer (i.e. the direction that is perpendicular to the magneto-sensitive axis and the sensitivity-influencing axis). Therefore, the current sensor 1 is hardly affected by the disturbing magnetic field in all directions.

Because the current sensor 1 is hardly affected by the disturbing magnetic field in all directions, the magnetic shield, which has been used to prevent the disturbing magnetic field conventionally, is omitted.

Figure 7A:
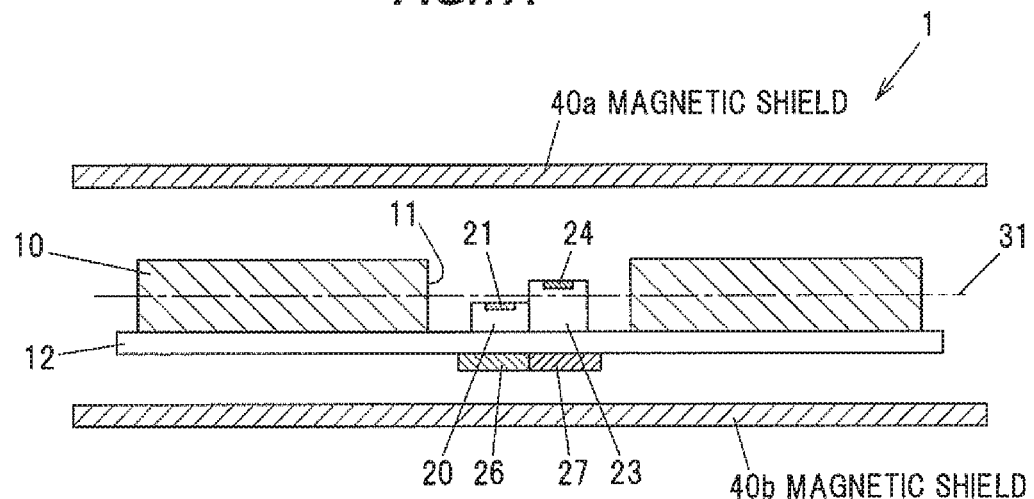
FIGS. 7A to 7C are vertical cross sectional views of the current sensors when a simple magnetic shield is provided in each current sensor.
Figure 7B:
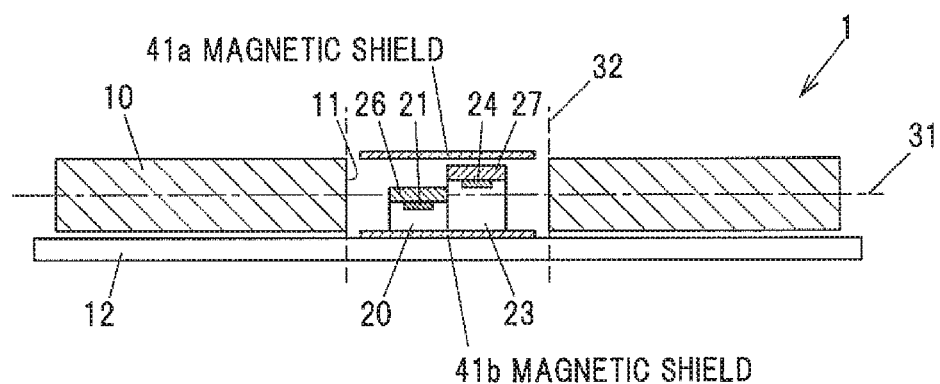
Figure 7C:
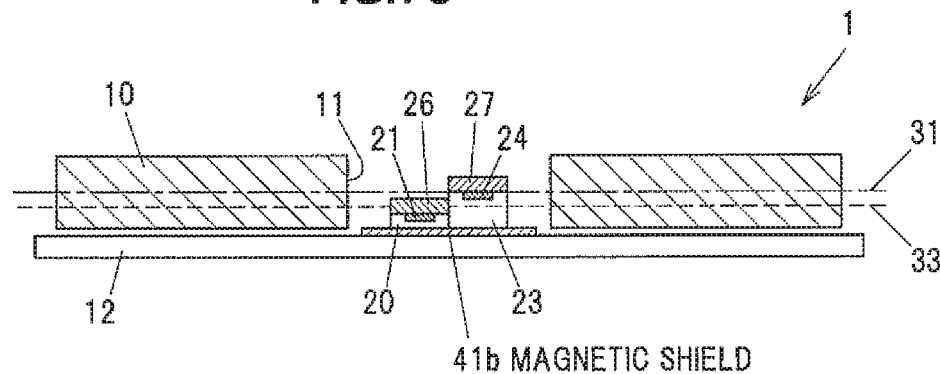

FIGS. 7A to 7C are vertical cross sectional views of the current sensors when a simple magnetic shield is provided in each current sensor 1.

In the example shown in FIG. 7A, the current sensor 1 further comprises two tabular magnetic shields 40a, 40b covering the both sides of the whole bus bar 10. It is preferable that a distance between the surface 31 and the magnetic shield 40a and a distance between the surface 31 and the magnetic shield 40b are equal to each other, in order to provide a magnetic field distribution in the thickness direction of the bus bar 10 symmetrically. The influence of the displacement in the thickness direction of the bus bar 10 can be minimized by providing the magnetic field distribution in the thickness direction of the bus bar 10 symmetrically, thereby making the inclinations with respect to the position of the magnetic field constant.

In the example shown in FIG. 7B, the current sensor 1 further comprises two tabular small sized magnetic shields 41a, 41b covering an upper side and a lower side of the first magnetic sensing element 20 and the second magnetic sensing element 23 inside a projection domain 32 in the thickness direction of the bus bar 10 of the hole 11 of the bus bar 10. Because the magnetic field is weakened in the projection domain 32, the magnetic saturation of the magnetic shield hardly occurs, so that it is possible to suppress the reduction in the shield effect. Note that the first bias magnetic field emission source 26 and the second bias magnetic field emission source 27 are installed in a space sandwiched by the magnetic shields 41a, 41b, respectively, in order to apply the bias magnetic field to the first magneto-sensitive portion 21 and the second magneto-sensitive portion 24 effectively.

In the example shown in FIG. 7C, the current sensor 1 further comprises only the magnetic shield 41b, which is selected from the magnetic shields 41a, 41b as shown in FIG. 7B, for covering the lower side of the first magnetic sensing element 20 and the second magnetic sensing element 23. The position of the point where the magnetic field becomes zero deviates from the surface 31 by locating the magnetic shield in the manner of top and bottom asymmetry.

Because the magnetic shield is installed at only the lower side in the example shown in FIG. 7C, the position of the point where the magnetic field becomes zero, which is represented with the dotted line 33, is shifted downwardly from the surface 31. Thereby, for example, it is possible to shift the position of the magneto-sensitive portion 21 downwardly and shift the position of the second magneto-sensitive portion 24 upwardly with respect to the point where the magnetic field becomes zero, by aligning the position of an upper surface of the second magneto-sensitive portion 24 with the surface 31.

In other words, it is possible to facilitate the implementation of the first magnetic sensing element 20 and the second magnetic sensing element 23 for making the increase and decrease of the output voltage of the first magnetic sensing element 20 to be opposite to the increase and decrease of the output voltage of the second magnetic sensing element 23 in response to the variation in magnetic field to be measured.

Effect of the Embodiment

According to the current sensor in the embodiment, it is possible to suppress not only the influence of the disturbing magnetic field in the magneto-sensitive axis direction of the magnetic sensing element but also the influence of the disturbing magnetic field in the sensitivity-influencing axis direction, by applying the bias magnetic fields in the directions opposite to each other to the respective magneto-sensitive portions of the two magnetic sensing elements and taking the output difference between the two magnetic sensing elements. Further, according to this structure, the magnetic shield for preventing the disturbing magnetic field can be omitted or simplified.

SUMMARY OF THE EMBODIMENT

Next, the technical idea grasped from the aforementioned embodiment is described with referring to the reference numerals used in the embodiment. However, the reference numerals and the like in the following description do not limit the constitutional elements of claims to the member or the like that is specifically described in the description of the embodiment.

[1] A current sensor (1) comprising a bus bar (10) through which an electric current to be measured flows, a first magnetic sensing element (20) including a first magneto-sensitive portion (21) comprising a magneto-resistive element (22a, 22b), and a second magnetic sensing element (23) including a second magneto-sensitive portion (24) comprising a magneto-resistive element (25a, 25b), in which a strength of a magnetic field generated by the electric current sensed by the first magneto-sensitive portion (21) is different from a strength of the magnetic field sensed by the second magneto-sensitive portion (24), in which a first bias magnetic field ($B_1$) is applied to the first magneto-sensitive portion (21) and a second bias magnetic field ($B_2$) in a direction opposite to a direction of the first bias magnetic field ($B_1$) is applied to the second magneto-sensitive portion (24).

[2] The current sensor (1) according to [1], in which the first bias magnetic field ($B_1$) and the second bias magnetic field ($B_2$) are parallel to a sensitivity-influencing axis direction of the first magneto-sensitive portion (21) and a sensitivity-influencing axis direction of the second magneto-sensitive portion (24).

[3] The current sensor (1) according to [1] or [2], in which the bus bar (10) comprises a tabular bus bar having a hole (11), and the first magnetic sensing element (20) and the second magnetic sensing element (23) are installed inside the hole (11) of the bus bar (10), and a position of the first magneto-sensitive portion (21) is different from a position of the second magneto-sensitive portion (24) in a thickness direction of the bus bar (10).

[4] The current sensor (1) according to [3], in which a magneto-sensitive axis direction of the first magneto-sensitive portion (21) is the same as a magneto-sensitive axis direction of the second magneto-sensitive portion (24), and a direction of the magnetic field generated by the electric current sensed by the first magneto-sensitive portion (21) is opposite to a direction of the magnetic field sensed by the second magneto-sensitive portion (24).

[5] The current sensor (1) according to [3] or [4], in which the strength of the magnetic field generated by the electric current increases and decreases linearly, and the first magneto-sensitive portion (21) and the second magneto-sensitive portion (24) are located within an area in the thickness direction of the bus bar (10).

[6] The current sensor (1) according to any one of [3] to [5], further comprising two tabular magnetic shields (40a, 40b) covering both sides of the bus bar (10) entirely.

[7] The current sensor (1) according to any one of [3] to [5], further comprising two tabular magnetic shields (41a, 41b) covering an upper side and a lower side of the first magnetic sensing element (20) and the second magnetic sensing element (23), inside a projection domain in the thickness direction of the bus bar (10) of the hole (11) of the bus bar (10).

[8] The current sensor (1) according to any one of [3] to [5], further comprising a tabular magnetic shield (41b) covering a lower side of the first magnetic sensing element (20) and the second magnetic sensing element (23), inside a projection domain in the thickness direction of the bus bar (10) of the hole (11) of the bus bar (10).

The embodiment of the claimed invention is described as above, but the present invention is not limited to the detailed description of the embodiment, and various modifications can be enforced without going beyond the scope of the invention. For example, plural current sensors in the embodiment according to the present invention may be arranged for the use.

Also, the detailed description of the embodiment described as above does not limit the invention according to the claims. Further note that all of combinations of the features described in the detailed description of the embodiment are not necessarily essential to the means for solving problem of the invention.

What is claimed is:

1. A current sensor, comprising:
a bus bar through which an electric current to be measured flows;
a first magnetic sensing element including a first magneto-sensitive portion comprising a magneto-resistive element; and
a second magnetic sensing element including a second magneto-sensitive portion comprising a magneto-resistive element,
wherein a strength of a magnetic field generated by the electric current to be measured sensed by the first magneto-sensitive portion is different from a strength of the magnetic field sensed by the second magneto-sensitive portion, in which a first bias magnetic field is applied to the first magneto-sensitive portion, and a second bias magnetic field in a direction opposite to a direction of the first bias magnetic field is applied to the second magneto-sensitive portion, and
wherein the bus bar comprises a tabular bus bar including a hole, the first magnetic sensing element and the second magnetic sensing element are installed inside the hole of the bus bar, and a position of the first magneto-sensitive portion is different from a position of the second magneto-sensitive portion in a thickness direction of the bus bar.

2. The current sensor according to claim 1, wherein the first bias magnetic field and the second bias magnetic field are parallel to a sensitivity-influencing axis direction of the first magneto-sensitive portion and a sensitivity-influencing axis direction of the second magneto-sensitive portion.

3. The current sensor according to claim 1, wherein a magneto-sensitive axis direction of the first magneto-sensitive portion is the same as a magneto-sensitive axis direction of the second magneto-sensitive portion, and a direction of the magnetic field generated by the electric current to be measured sensed by the first magneto-sensitive portion is opposite to a direction of the magnetic field sensed by the second magneto-sensitive portion.

4. The current sensor according to claim 1, wherein the strength of the magnetic field generated by the electric current to be measured increases and decreases linearly, and the first magneto-sensitive portion and the second magneto-sensitive portion are located within an area in the thickness direction of the bus bar.

5. The current sensor according to claim 1, further comprising:
two tabular magnetic shields covering both sides of the bus bar entirely.

6. The current sensor according to claim 1, further comprising:
two tabular magnetic shields covering an upper side and a lower side of the first magnetic sensing element and the second magnetic sensing element, inside a projection domain, in the thickness direction of the bus bar, of the hole of the bus bar.

7. The current sensor according to claim 1, further comprising:
a tabular magnetic shield covering a lower side of the first magnetic sensing element and the second magnetic sensing element, inside a projection domain, in the thickness direction of the bus bar, of the hole of the bus bar.

8. The current sensor according to claim 1, wherein the first magnetic sensing element is arranged such that a magneto-sensitive axis direction of the first magneto-sensitive portion is parallel to a principal surface of the bus bar, and the second magnetic sensing element is arranged such that a magneto-sensitive axis direction of the second magneto-sensitive portion is parallel to the principal surface of the bus bar.

9. The current sensor according to claim 8, wherein the first magneto-sensitive portion is located below a point where the magnetic field to be measured becomes zero, and the second magneto-sensitive portion is located above the point where the magnetic field to be measured becomes zero.

10. The current sensor according to claim 1, further comprising:
two tabular magnetic shields covering an upper side and a lower side of the first magnetic sensing element and the second magnetic sensing element, only inside a projection domain, in the thickness direction of the bus bar, of the hole of the bus bar.

11. The current sensor according to claim 1, further comprising:
a tabular magnetic shield covering a lower side of the first magnetic sensing element and the second magnetic sensing element, only inside a projection domain, in the thickness direction of the bus bar, of the hole of the bus bar.

12. The current sensor according to claim 10, wherein, in a plan view, a portion of the hole is exposed from the two tabular magnetic shields.

13. The current sensor according to claim 11, wherein, in a plan view, a portion of the hole is exposed from the tabular magnetic shield.

14. The current sensor according to claim 10, wherein the first magnetic sensing element and the second magnetic sensing element are sandwiched between the two tabular magnetic shields.

15. The current sensor according to claim 1, wherein the first magnetic sensing element is attached to the second magnetic sensing element at a center of the hole.

16. The current sensor according to claim 1, further comprising:
a substrate on which the first magnetic sensing element and the second magnetic sensing element are mounted such that a bottom surface of the first magnetic sensing element is flush with a bottom surface of the second magnetic sensing element.

17. The current sensor according to claim 16, wherein, with respect to an upper surface of the substrate, a height of the first magnetic sensing element is different from a height of the second magnetic sensing element.

18. The current sensor according to claim 1, wherein on a surface, which is parallel to a principal surface of the bus bar and passes through a center of the thickness direction of the bus bar, the magnetic field is zero.

19. The current sensor according to claim 18, wherein the first magneto-sensitive portion and the second magneto-sensitive portion are located on opposing sides of the surface which is parallel to the principal surface of the bus bar and passes through the center of the thickness direction of the bus bar.

* * * * *